US007276909B2

(12) United States Patent
Nukihara et al.

(10) Patent No.: US 7,276,909 B2
(45) Date of Patent: Oct. 2, 2007

(54) RF TRANSMISSION METHOD, MRI APPARATUS, AND AUXILIARY COIL

(75) Inventors: Kenichi Nukihara, Tokyo (JP); Takashi Ishiguro, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/392,042

(22) Filed: Mar. 29, 2006

(65) Prior Publication Data

US 2006/0220644 A1    Oct. 5, 2006

(30) Foreign Application Priority Data

Apr. 1, 2005   (JP) ............................. 2005-106189

(51) Int. Cl.
*G01V 3/00*    (2006.01)
(52) U.S. Cl. ..................... 324/322; 324/318; 324/307; 324/319
(58) Field of Classification Search ........ 324/318–322; 600/410, 411, 422, 427
See application file for complete search history.

(56) References Cited

U.S. PATENT DOCUMENTS

| | | | |
|---|---|---|---|
| 4,680,549 A | | 7/1987 | Tanttu et al. |
| 4,703,274 A | | 10/1987 | Kaufman et al. |
| 5,003,265 A | | 3/1991 | Leussler et al. |
| 5,041,791 A | * | 8/1991 | Ackerman et al. ........... 324/318 |
| 5,202,635 A | * | 4/1993 | Srinivasan et al. ......... 324/318 |
| 5,414,359 A | | 5/1995 | Mehlkopf et al. |
| 5,664,568 A | * | 9/1997 | Srinivasan et al. ......... 324/318 |
| 5,777,474 A | * | 7/1998 | Srinivasan ................... 324/318 |
| 5,939,883 A | | 8/1999 | Green et al. |
| 5,999,000 A | * | 12/1999 | Srinivasan ................... 324/318 |
| 6,040,697 A | * | 3/2000 | Misic ........................... 324/318 |
| 6,177,797 B1 | * | 1/2001 | Srinivasan ................... 324/318 |
| 6,396,273 B2 | * | 5/2002 | Misic ........................... 324/318 |
| 6,397,094 B1 | | 5/2002 | Luedeke et al. |
| 6,549,800 B1 | | 4/2003 | Atalar et al. |
| 6,714,013 B2 | * | 3/2004 | Misic ........................... 324/318 |
| 6,850,064 B1 | * | 2/2005 | Srinivasan ................... 324/318 |

(Continued)

FOREIGN PATENT DOCUMENTS

DE    4238831 A1    5/1994

(Continued)

OTHER PUBLICATIONS

Hoult D I et al., "A High-Sensitivity, High-B1, Homogeneity Probe For Quantitation of Metabolites," Magnetic Resonance in Medicine, Academic Press, Duluth, MN, US, vol. 16, No. 3, Dec. 1, 1990, pp. 411-417.

(Continued)

*Primary Examiner*—Diego Gutierrez
*Assistant Examiner*—Tiffany A. Fetzner
(74) *Attorney, Agent, or Firm*—Armstrong Teasdale LLP

(57) ABSTRACT

An object of the present invention is to intensify the strength of a magnetic field to be applied to a subject. An auxiliary coil is interposed between a body coil incorporated in a magnet assembly included in an MRI apparatus and the subject. When RF pulses are transmitted from the body coil, an induced current flows through the auxiliary coil and generates a magnetic field. The magnetic field excites the subject near the subject.

7 Claims, 3 Drawing Sheets

U.S. PATENT DOCUMENTS

| | | | |
|---|---|---|---|
| 6,980,001 B2 | 12/2005 | Paley et al. | |
| 7,012,430 B2* | 3/2006 | Misic | 324/318 |
| 7,053,615 B2 | 5/2006 | Lazar et al. | |
| 7,123,012 B2* | 10/2006 | Srinivasan | 324/318 |
| 2001/0005136 A1* | 6/2001 | Misic | 324/318 |
| 2001/0033165 A1 | 10/2001 | Tomanek et al. | |
| 2002/0167321 A1* | 11/2002 | Misic | 324/318 |
| 2004/0044281 A1 | 3/2004 | Paley et al. | |
| 2004/0137872 A1* | 7/2004 | Srinivasan | 455/344 |
| 2004/0155657 A1* | 8/2004 | Misic | 324/318 |
| 2005/0174115 A1 | 8/2005 | Lazar et al. | |
| 2006/0220644 A1* | 10/2006 | Nukihara et al. | 324/307 |

FOREIGN PATENT DOCUMENTS

| | | |
|---|---|---|
| JP | 2000-116619 | 4/2000 |
| JP | 2004-248928 | 9/2004 |
| WO | WO 03/098247 A1 | 11/2003 |

OTHER PUBLICATIONS

Edelstein W A et al., "Electronic Decoupling of Surface-Coil Receivers for NMR Imaging and Spectroscopy," Journal of Magnetic Resonance, Academic Press, London, GB, vol. 67, 1986, pp. 156-161.

Barker P B et al., "Mode-Switched Radiofrequency Coils," Journal of Magnetic Resonance, Academic Press, Orlando, FL, US, vol. 89, No. 2, Sep. 1990, pp. 431-435.

Hisatoshi Maeda et al., "A Wireless Axial Pair Resonator," Magnetic Resonance in Medicine, Academic Press, Duluth, MN, US, vol. 29, No. 8, Apr. 1, 1993, pp. 567-570.

Gilderdale D J et al., "The Performance of Mutually-Coupled Coils for Magnetic Resonance Signal Recovery," Magnetic Resonance Imaging, Tarrytown, NY, US, vol. 2, No. 8, Aug. 1, 1989, p. 956.

English translation of a portion of DE4238831A1.

European Search Report and Opinion, European Patent Office, Reference 179972/11372, App. No. 06251680.2-2209, Date of completion of search Jun. 23, 2006, 12 pages.

International Search Report;Place of Search—Munich; Date Jul. 3, 2006; Reference 179972/11372, Application No./ Patent No. 06251680.2-2209; 11 pgs.

* cited by examiner

RF TRANSMISSION METHOD, MRI APPARATUS, AND AUXILIARY COIL

CROSS REFERENCE TO RELATED APPLICATIONS

This application claims the benefit of Japanese Application No. 2005-106189 filed Apr. 1, 2005.

BACKGROUND OF THE INVENTION

The present invention relates to a radio-frequency (RF) transmission method, a magnetic resonance imaging (MRI) apparatus, and an auxiliary coil. More particularly, the present invention is concerned with an RF transmission method, an MRI apparatus, and an auxiliary coil which make it possible to intensify the strength of a magnetic field to be applied to a subject.

In a magnet assembly included in a typical MRI apparatus, a body coil, an RF shield, gradient coils, and a main magnetic field generation magnet are disposed in that order from the side of a bore, which is an imaging space, of the magnet assembly to the external side thereof (refer to, for example, Patent Documents 1 and 2).

[Patent Document 1] Japanese Unexamined Patent Publication No. 2000-116619

[Patent Document 2] Japanese Unexamined Patent Publication No. 2004-248928

A bore that is an imaging space in an MRI apparatus has a large inner diameter that is large enough to accommodate even a huge subject (patient). There is a distance between a body coil incorporated in a magnet assembly and a subject.

However, if there is a distance between a transmitter coil and a subject, the strength of a magnetic field to be applied to the subject is so feeble that a large power is needed to transmit RF pulses from the body coil so as to excite the subject.

SUMMARY OF THE INVENTION

Therefore, an object of the present invention is to provide an RF transmission method, an MRI apparatus, and an auxiliary coil which make it possible to intensify the strength of a magnetic field to be applied to a subject.

According to the first aspect of the present invention, there is provided an RF transmission method in which an auxiliary coil is interposed between a transmitter coil incorporated in an MRI apparatus and a subject, and a magnetic field generated by a current induced in the auxiliary coil by RF pulses transmitted from the transmitter coil is used to excite the subject.

As long as the transmitter coil alone is employed, the distance between the subject and a transmitter element included in a transmitter coil is so long that the transmitter coil cannot produce a strong magnetic field near the center of the subject.

In the RF transmission method according to the first aspect, the auxiliary coil is used to feed a current to the element, which is included in the transmitter coil with the auxiliary coil located near a subject, owing to the mutual inductance between the transmitter and auxiliary coils. Consequently, a strong magnetic field is generated near the center of the subject. Moreover, since the auxiliary coil is located nearer the subject than the transmitter coil is, a current flowing through the auxiliary coil dominantly generates an exciting magnetic field near the subject. Namely, the auxiliary coil is designed to produce a homogenous magnetic field near the center of a subject. Otherwise, when the coupling between the auxiliary coil and transmitter coil is feeble, the auxiliary coil is designed so that the sum of strengths of magnetic fields produced by the auxiliary coil and transmitter coil will express a uniform strength near the center of the subject. However, if the auxiliary coil resonates at the same frequency as the transmitter coil does, coupling takes place. When single-loop coils (completely non-resonant) are adopted as the transmitter coil and auxiliary coil, opposite-phase currents (having a phase difference of 180°) flow to cancel generated magnetic fields. An impedance offered by the auxiliary coil is therefore adjusted so that in-phase currents (having a phase difference of 0°) will flow through the transmitter coil and auxiliary coil respectively. Consequently, the strength of a magnetic field to be applied to a subject is intensified.

According to the second aspect of the present invention, there is provided an RF transmission method identical to the RF transmission method according to the first aspect except that the maximum values of currents flowing through the transmitter coil and auxiliary coil respectively being in phase with each other which are attained at a frequency indicated with an in-phase resonance point are larger than the maximum values of currents flowing through the transmitter coil and auxiliary coil respectively being 180° out of phase with each other which are attained at a frequency indicated with an opposite-phase resonance point, or that the in-phase resonance point is observed but the opposite-phase resonance point is not observed.

Since the resonant frequencies of coils vary depending on the presence of a subject, the coils should be tuned. In the RF transmission method according to the second aspect, the coils are tuned so that the maximum values of currents that are in phase with each other will be larger than the maximum values of currents that are 180° out of phase. Otherwise, the coils are tuned so that the maximum-value currents that are in phase with each other will substantially flow the coils. Consequently, the strength of a magnetic field to be applied to a subject can be intensified.

According to the third aspect of the present invention, there is provided an RF transmission method identical to the RF transmission method according to the second aspect except that the auxiliary coil is a birdcage-like coil.

In the RF transmission method according to the third aspect, since a birdcage-like coil is adopted as the auxiliary coil, a subject can be efficiently excited over the entire surface of the subject's trunk.

According to the fourth aspect of the present invention, there is provided an RF transmission method identical to the RF transmission method according to any of the first to third aspects except that the transmitter coil is a body coil.

In the RF transmission method according to the fourth aspect, since the strength of a magnetic field to be applied to a subject is intensified; an amount of power needed to transmit RF pulses from the body coil is reduced.

According to the fifth aspect of the present invention, there is provided an MRI apparatus including a transmitter coil that transmits RF pulses, and an auxiliary coil that is disposed nearer a subject than the transmitter coil is such that the auxiliary coil itself directly excites the subject using a magnetic field generated by a current induced by the RF pulses.

In the MRI apparatus according to the fifth aspect, when RF pulses are transmitted from the transmitter coil, an induced current flows through the auxiliary coil and generates a magnetic field. The magnetic field from the auxiliary coil excites the subject near the subject. In short, the auxiliary coil works to relay the RF pulses from the transmitter coil. Consequently, transmission efficiency improves, and the strength of the magnetic field to be applied to the subject is intensified.

According to the sixth aspect of the present invention, there is provided an MRI apparatus identical to the MRI apparatus according to the fifth aspect except that the maximum values of currents flowing through the transmitter coil and auxiliary coil respectively being in phase with each other which are attained at a frequency indicated with an in-phase resonance point are larger than the maximum values of currents flowing through the transmitter coil and auxiliary coil respectively being 180° out of phase with each other which are attained at a frequency indicated with an opposite-phase resonance point, or that the in-phase resonance point is observed but the opposite-phase resonance point is not observed.

Since the resonant frequencies of coils vary depending on the presence of a subject, the coils should be tuned. In the MRI apparatus according to the sixth aspect, the coils are tuned so that the maximum values of the currents being in phase with each other will be larger than the maximum values of the currents being 180° out of phase with each other. Consequently, the strength of a magnetic field being applied to a subject is intensified.

According to the seventh aspect of the present invention, there is provided an MRI apparatus identical to the MRI apparatus according to the fifth or sixth aspect except that the auxiliary coil is a birdcage-like coil.

In the MRI apparatus according to the sixth aspect, since a birdcage-like coil is adopted as the auxiliary coil, a subject is efficiently excited over the entire surface of the subject's trunk without the auxiliary coil and the transmitter coil being in direct contact.

According to the eighth aspect of the present invention, there is provided an MRI apparatus identical to the MRI apparatus according to any of the fifth to seventh aspects except that the transmitter coil is a body coil.

In the MRI apparatus according to the eighth aspect, since the strength of a magnetic field being applied to a subject is intensified, an amount of power needed to transmit RF pulses from the body coil is reduced.

According to the ninth aspect of the present invention, there is provided an auxiliary coil that is interposed between a subject and a transmitter coil that is included in an MRI apparatus. The auxiliary coil produces a magnetic field as a result of a flowing current induced by RF pulses sent from the transmitter coil so that the auxiliary coil itself directly excites a subject.

In the auxiliary coil according to the ninth aspect, when the transmitter coil transmits RF pulses, an induced current flows through the auxiliary coil and generates a magnetic field. The magnetic field of the auxiliary coil directly excites a subject In short, the auxiliary coil works to relay the RF pulses through mutual inductance between the transmitter coil and the auxiliary coil without direct contact between the transmitter coil and the auxiliary coil. Consequently, transmission efficiency improves, and the strength of a magnetic field to be applied to a subject is intensified.

According to the tenth aspect of the present invention, there is provided an auxiliary coil identical to the auxiliary coil according to the ninth aspect except that the auxiliary coil is a birdcage-like coil.

In the auxiliary coil according to the tenth aspect, since a birdcage-like coil is adopted as the auxiliary coil, a subject can be efficiently excited over the entire surface of the subject's trunk.

According to an RF transmission method, an MRI apparatus, and an auxiliary coil in which the present invention is implemented, since the auxiliary coil works to relay RF pulses from the transmitter coil, transmission efficiency improves and the strength of a magnetic field to be applied directly from the auxiliary coil itself to a subject can be intensified. Moreover, a power needed to transmit RF pulses from a transmitter coil can be reduced.

An RF transmission method, an MRI apparatus, and an auxiliary coil in accordance with the present invention can be used to perform magnetic resonance imaging.

Further objects and advantages of the present invention will be apparent from the following description of the preferred embodiments of the invention as illustrated in the accompanying drawings.

DETAILED DESCRIPTION OF THE INVENTION

The present invention will be described in relation to an illustrated embodiment. Noted is that the present invention will not be limited to the embodiment.

Figure 1:
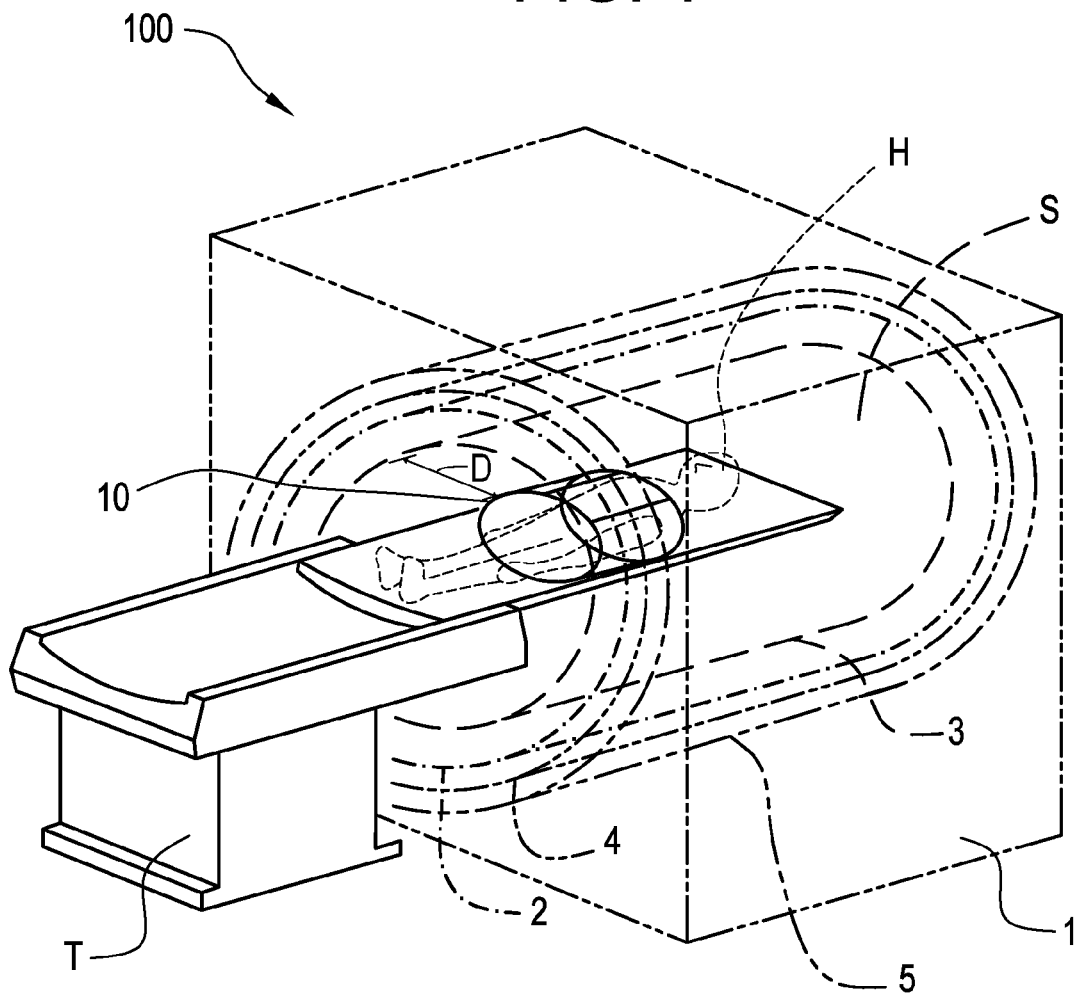
FIG. 1 is a perspective view showing an MRI apparatus and an auxiliary coil in accordance with the first embodiment.

FIG. 1 is a perspective view showing an MRI apparatus 100 and an auxiliary coil 10 in accordance with the first embodiment.

In the MRI apparatus 100, a magnet assembly 1 is formed with a bore (cylindrical space) S into which a subject H lying down on a cradle of a table T is inserted. In the magnet assembly 1, a body coil 2, an RF shield 3, and gradient coils 4 are concentrically disposed in that order from the bore S side of the magnet assembly toward the external side thereof. A main magnetic field generation magnet 5 is disposed outside the gradient coil 4.

The auxiliary coil 10 is a birdcage-like coil and worn by the subject H.

Figure 2:
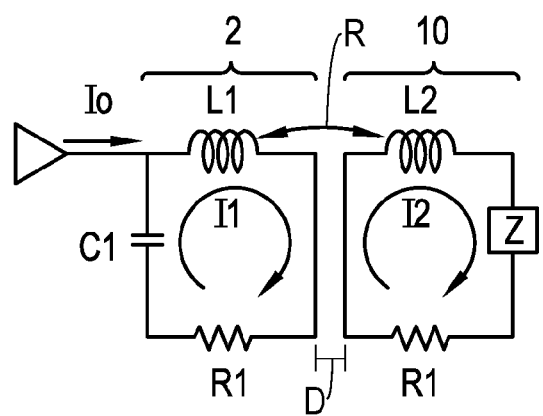
FIG. 2 is a circuit diagram showing equivalent circuits of a body coil and an auxiliary coil employed in the first embodiment.

FIG. 2 shows equivalent circuits of the body coil 2 and auxiliary coil 10 respectively.

The body coil 2 is of a resonant type comprised of an inductance L1, a capacitance C, and a resistance R1.

The auxiliary coil 10 is comprised of an inductance L2, an impedance Z, and a resistance R2.

The body coil 2 and auxiliary coil 10 are coupled without direct contact to offer a mutual inductance M. Specifically, body coil 2 and auxiliary coil 10 are spaced a distance D apart and coupled by a relay R of the RF pulses from the body coil 2 and the auxiliary coil 10.

Figure 3:
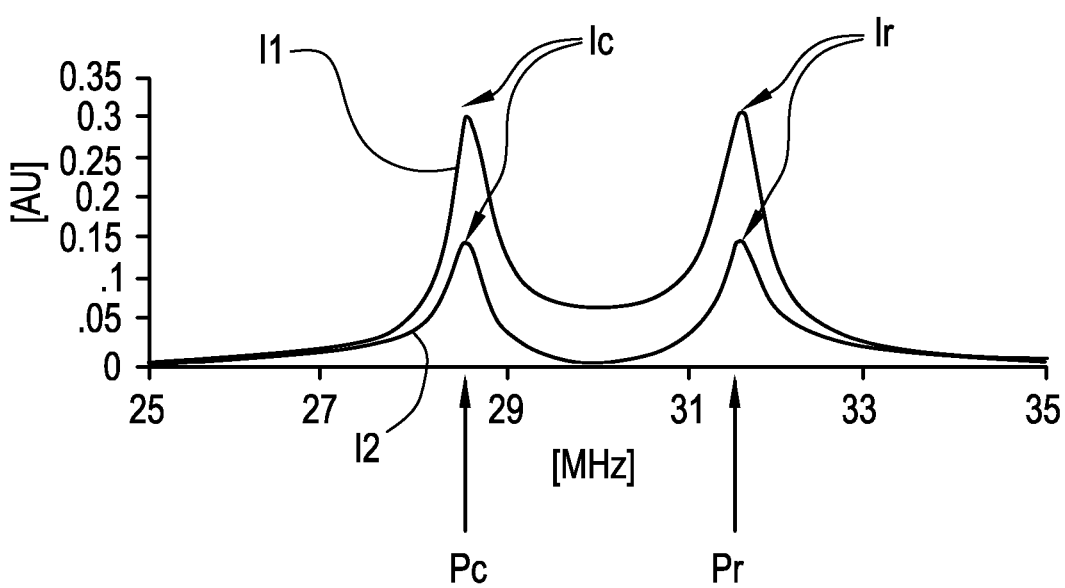
FIG. 3 is a graph showing the frequency characteristics exhibited by a body-coil current I1 and an auxiliary-coil current I2 respectively when the impedance Z offered by the auxiliary coil assumes a value Za.

Assuming that Io denotes a current fed from a transmission amplifier, I1 denotes a body-coil current that is a current flowing through the body coil 2, and I2 denotes an auxiliary-coil current that is a current flowing through the auxiliary coil 10, the following equations are established:

$I1 = b \cdot Io/\Delta$ $I2 = -j \cdot \omega \cdot M \cdot Io/\Delta$ $\Delta = a \cdot b - \omega^2 \cdot M^2$ $a = R1 + j \cdot \omega \cdot L1 + 1/(j \cdot \omega \cdot C1)$ $b = R2 + j \cdot \omega \cdot L2 + Z$ FIG. 3 graphically shows the body-coil current I1 and auxiliary-coil current I2 that flow when the impedance Z offered by the auxiliary coil assumes a value Za. The current values indicated on the axis of ordinates are expressed in a normalized unit.

Figure 4:
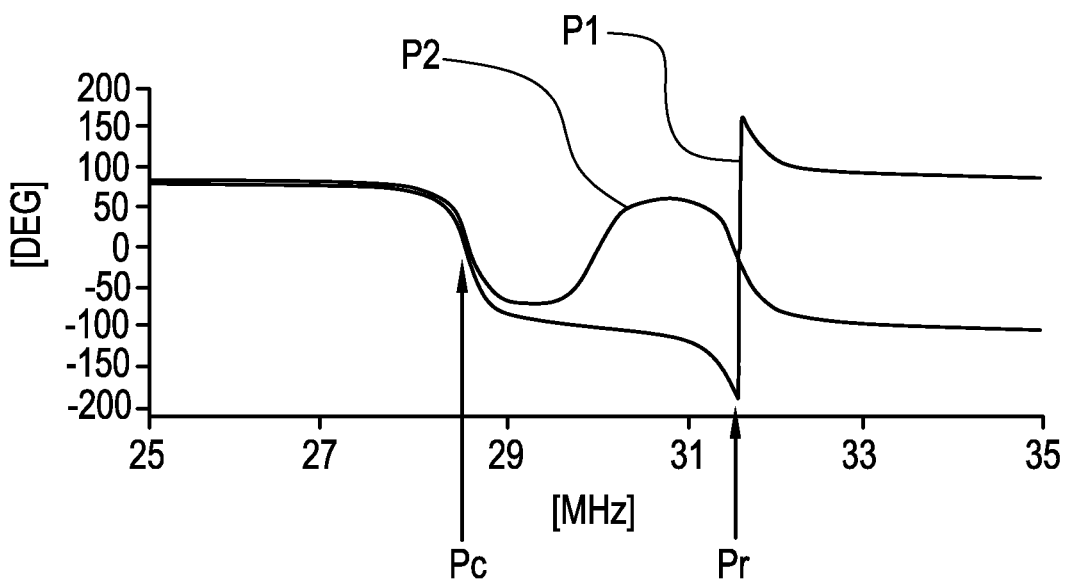
FIG. 4 is a graph showing the frequency characteristics exhibited by the body-coil current I1 and an auxiliary-coil current I2 respectively when the impedance Z offered by the auxiliary coil assumes the value Za.

FIG. 4 graphically shows the phase P1 of the body-coil current and the phase P2 of the auxiliary-coil current that are observed when the impedance Z offered by the auxiliary coil assumes the value Za.

As seen from FIG. 3 and FIG. 4, an opposite-phase resonance point Pr indicates a frequency at which the phase P1 of the transmitter-coil current and the phase P2 of the auxiliary-coil current are opposite to each other and the body-coil current I1 and auxiliary-coil current I2 have the maximum values. An in-phase resonance point Pc indicates a frequency at which the phase P1 of the transmitter-coil current and the phase P2 of the auxiliary-coil current are identical to each other and the body-coil current I1 and auxiliary-coil current I2 have the maximum values.

However, when the impedance Z offered by the auxiliary coil assumes a value Za, the opposite-phase resonance point Pr and in-phase resonance point Pc are close to each other, and the maximum values Ir of the opposite-phase currents are almost the same as the maximum values Ic of the in-phase currents. The effect of intensifying the strength of a magnetic field to be applied to a subject cannot be expected.

Figure 5:
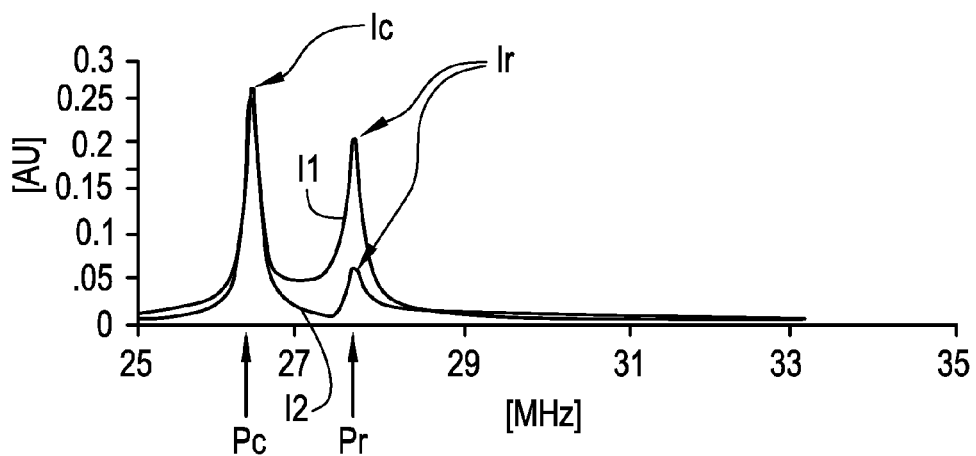
FIG. 5 is a graph showing the frequency characteristics exhibited by the body-coil current I1 and an auxiliary-coil current I2 respectively when the impedance Z offered by the auxiliary coil assumes a value Zb.

FIG. 5 graphically shows the body-coil current I1 and auxiliary-coil current I2 that flow when the impedance Z offered by the auxiliary coil assumes a capacitive value Zc other than the value Za.

When the impedance Z offered by the auxiliary coil assumes the value Zb, compared with when the impedance Z assumes the value Za, the opposite-phase resonance point Pr and in-phase resonance point Pc are separated from each other. The maximum values of the in-phase currents Ic are larger than the maximum values of the opposite-phase currents Ir. The effect of intensifying the strength of a magnetic field to be applied to a subject is expected.

Figure 6:
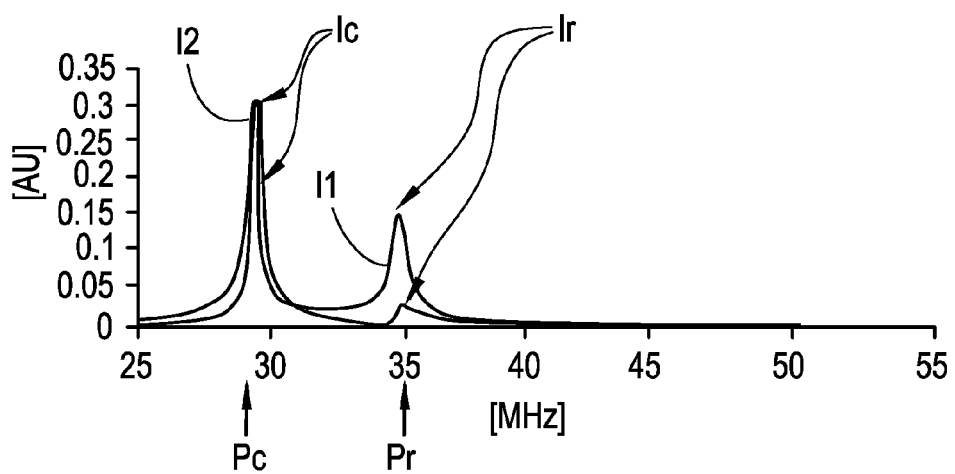
FIG. 6 is a graph showing the frequency characteristics exhibited by the body-coil current I1 and an auxiliary-coil current I2 respectively when the impedance Z offered by the auxiliary coil assumes a value Zc.

FIG. 6 graphically shows the body-coil current I1 and auxiliary-coil current I2 that flow when the impedance Z offered by the auxiliary coil assumes a capacitive value Zc other than the value Zb.

When the impedance Z assumes the value Zc, compared with when the impedance Z assumes the value Zb, the opposite-phase resonance point Pr and in-phase resonance point Pc are separated from each other, and the maximum values of the in-phase currents Ic are larger than the maximum values of the opposite-phase currents Ir. The effect of intensifying the strength of a magnetic field to be applied to a subject is expected.

Figure 7:
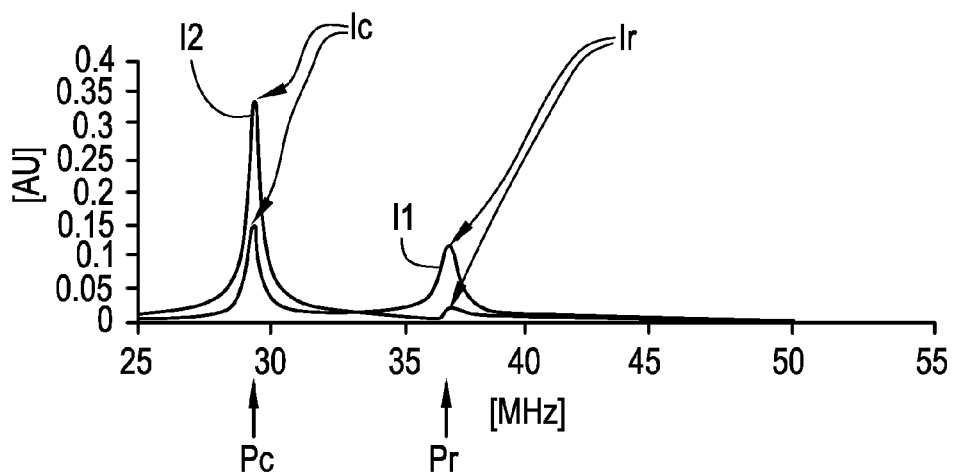
FIG. 7 is a graph showing the frequency characteristics exhibited by the body-coil current I1 and an auxiliary-coil current I2 respectively when the impedance Z offered by the auxiliary coil assumes a value Zd.

FIG. 7 graphically shows the body-coil current I1 and auxiliary-coil current I2 that flow when the impedance Z offered by the auxiliary coil assumes the capacitive value Zd other than the value Zc.

When the impedance Z assumes the value Zd, compared with when the impedance Z assumes the value Zc, the opposite-phase resonance point Pr and in-phase resonance point Pc are separated from each other, and the maximum values of the in-phase currents Ic are larger than the maximum values of the opposite-phase currents Ir. The effect of intensifying the strength of a magnetic field to be applied to a subject is expected.

As mentioned above, it will be understood that the strength of a magnetic field to be applied to a subject can be intensified by adjusting the impedance Z offered by the auxiliary coil 10.

The MRI apparatus 100 and auxiliary coil 10 in accordance with the first embodiment provide the advantages described below.

(1) When RF pulses are transmitted from the body coil 2 over distance D, an induced current I2 flows through the auxiliary coil 10 and generates a magnetic field such that auxiliary coil 10 itself directly excites the subject H. In short, the RF pulses are relayed through a mutual inductance between the body coil 2 and the auxiliary coil 10 without direct contact between the body coil 2 and the auxiliary coil 10. Consequently, transmission efficiency improves, and the strength of a magnetic field to be applied to a subject can be intensified. Moreover, a power needed to transmit RF pulses from the body coil 2 can be reduced.

(2) Since the auxiliary coil 10 is a birdcage-like coil, the subject H can be efficiently excited over the surface of the subject's trunk.

Many widely different embodiments of the invention may be configured without departing from the spirit and the scope of the present invention. It should be understood that the present invention is not limited to the specific embodiments described in the specification, except as defined in the appended claims.

The invention claimed is:

1. An RF transmission method of using a magnetic field, the method comprising:

generating a magnetic field in an MRI apparatus by inducing a current in an auxiliary birdcage-like coil which is radially interposed between a transmitter coil and a subject, with the auxiliary coil and the transmitter coil being separated from one another, wherein inducing a current within the auxiliary coil comprises transmitting RF pulses and relaying those transmitted RF pulses from the transmitter coil to the auxiliary coil by mutual inductance, without contact between the transmitter coil and the auxiliary coil such that only the auxiliary coil itself, directly excites the subject; and adjusting an impedance of the auxiliary coil such that in-phase currents will flow through the transmitter coil and the auxiliary coil respectively.

2. The RF transmission method according to claim 1, wherein the maximum values of the in-phase currents, which are attained at a frequency indicated with an in-phase resonance point, are larger than the maximum values of out of phase currents, which are attained at a frequency indicated with an opposite-phase resonance point, the out of phase currents flow through the transmitter coil and the auxiliary coil respectively and are 180 degrees out of phase with each other.

3. The RF transmission method according to claim 1, wherein the transmitter coil is a body coil.

4. An MRI apparatus comprising:
a transmitter coil that transmits RF pulses;
an auxiliary birdcage-like coil that is radially disposed nearer a subject than the transmitter coil without directly contacting the transmitter coil, wherein the auxiliary coil relays the transmitted RF pulses from the transmitter coil to a subject through mutual inductance between the transmitter coil and the auxiliary coil without direct contact between the transmitter coil and the auxiliary coil, whereby only the auxiliary coil itself, directly excites a subject using a magnetic field generated by a current induced by the transmitted RF pulses which are transmitted and relayed by the mutual inductance without physical contact between the transmitter coil and the auxiliary coil; and
wherein the auxiliary coil comprises impedance that is adjustable such that in-phase currents will flow through the transmitter coil and the auxiliary coil respectively.

5. The MRI apparatus according to claim 4, wherein the maximum values of the in-phase currents, which are attained at a frequency indicated with an in-phase resonance point, are larger than the maximum values of out of phase currents, which are attained at a frequency indicated with an opposite-phase resonance point, the out of phase currents flow through the transmitter coil and the auxiliary coil respectively and are 180 degrees out of phase with each other.

6. The MRI apparatus according to claim 4, wherein the transmitter coil is a body coil.

7. An auxiliary coil that is radially interposed between a subject and a transmitter coil included within an MRI apparatus without physically contacting the transmitter coil, wherein the auxiliary coil relays transmitted RF pulses from the transmitter coil to the subject through mutual inductance between the transmitter coil and the auxiliary coil without physical contact between the transmitter coil and the auxiliary coil, whereby the auxiliary coil itself directly excites a subject using a magnetic field generated by a current induced by the transmitted RF pulses which are transmitted and relayed from the transmitter coil by the mutual inductance without physical contact between the transmitter coil and the auxiliary coil, wherein the auxiliary coil comprises an impedance that is adjustable such that in-phase currents will flow through the transmitter coil and the auxiliary coil respectively.

* * * * *